(12) United States Patent
Hoshi et al.

(10) Patent No.: US 10,497,784 B2
(45) Date of Patent: Dec. 3, 2019

(54) SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Takashi Shiigi, Matsumoto (JP); Shoji Yamada, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/988,661

(22) Filed: May 24, 2018

(65) Prior Publication Data

US 2018/0277638 A1    Sep. 27, 2018

Related U.S. Application Data

(63) Continuation of application No. PCT/JP2017/017428, filed on May 8, 2017.

(30) Foreign Application Priority Data

Jun. 3, 2016   (JP) .................. 2016-111760

(51) Int. Cl.
*H01L 29/16*       (2006.01)
*H01L 21/8234*     (2006.01)
(Continued)

(52) U.S. Cl.
CPC ...... *H01L 29/1608* (2013.01); *H01L 21/8213* (2013.01); *H01L 21/8234* (2013.01);
(Continued)

(58) Field of Classification Search
CPC ............................................... H01L 29/66325
See application file for complete search history.

(56) References Cited

U.S. PATENT DOCUMENTS

2006/0172494 A1    8/2006   Kohlmann-Von Platen et al.
2009/0127624 A1    5/2009   Sumitomo et al.
(Continued)

FOREIGN PATENT DOCUMENTS

JP    2006-513563 A    4/2006
JP    2009-147297 A    7/2009
(Continued)

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.
B. Jayant Baliga, "Silicon Carbide Power Devices", USA, World Scientific Publishing Co., pp. 60-69, Mar. 30, 2006.

*Primary Examiner* — Yu-Hsi D Sun
(74) *Attorney, Agent, or Firm* — Rabin & Berdo, P.C.

(57) ABSTRACT

A current sensing part that detects overcurrent of a main semiconductor element is arranged on a same silicon carbide base as the main semiconductor element. An isolating part is arranged between the main semiconductor element and the current sensing part. The isolating part has a function of suppressing interference of the main semiconductor element and the current sensing part at the silicon carbide base. The isolating part is constituted by a trench provided a predetermined depth from a front surface of the silicon carbide base. An insulating film is provided in the trench, along inner walls of the trench. A poly-silicon layer is provided on the insulating film. With such a configuration, decreases in breakdown voltage of the current sensing part may be prevented.

11 Claims, 6 Drawing Sheets

(51) Int. Cl.
   *H01L 29/78*    (2006.01)
   *H01L 27/06*    (2006.01)
   *H01L 27/085*   (2006.01)
   *H01L 21/82*    (2006.01)
   *H01L 27/088*   (2006.01)
   *H01L 29/04*    (2006.01)
   *H01L 29/06*    (2006.01)

(52) U.S. Cl.
   CPC .......... *H01L 27/06* (2013.01); *H01L 27/0629* (2013.01); *H01L 27/085* (2013.01); *H01L 29/78* (2013.01); *H01L 29/7804* (2013.01); *H01L 29/7815* (2013.01); *H01L 21/823481* (2013.01); *H01L 27/088* (2013.01); *H01L 29/045* (2013.01); *H01L 29/0653* (2013.01)

(56) References Cited

U.S. PATENT DOCUMENTS

| | | | |
|---|---|---|---|
| 2014/0319540 A1 | 10/2014 | Sugimoto | |
| 2016/0087094 A1* | 3/2016 | Takaya | H01L 29/7813 257/48 |
| 2016/0372584 A1* | 12/2016 | Kimura | H01L 29/7397 |

FOREIGN PATENT DOCUMENTS

| | | |
|---|---|---|
| JP | 2013-016538 A | 1/2013 |
| JP | 2014-099444 A | 5/2014 |
| JP | 2014-216465 A | 11/2014 |
| JP | 2016-063107 A | 4/2016 |

* cited by examiner

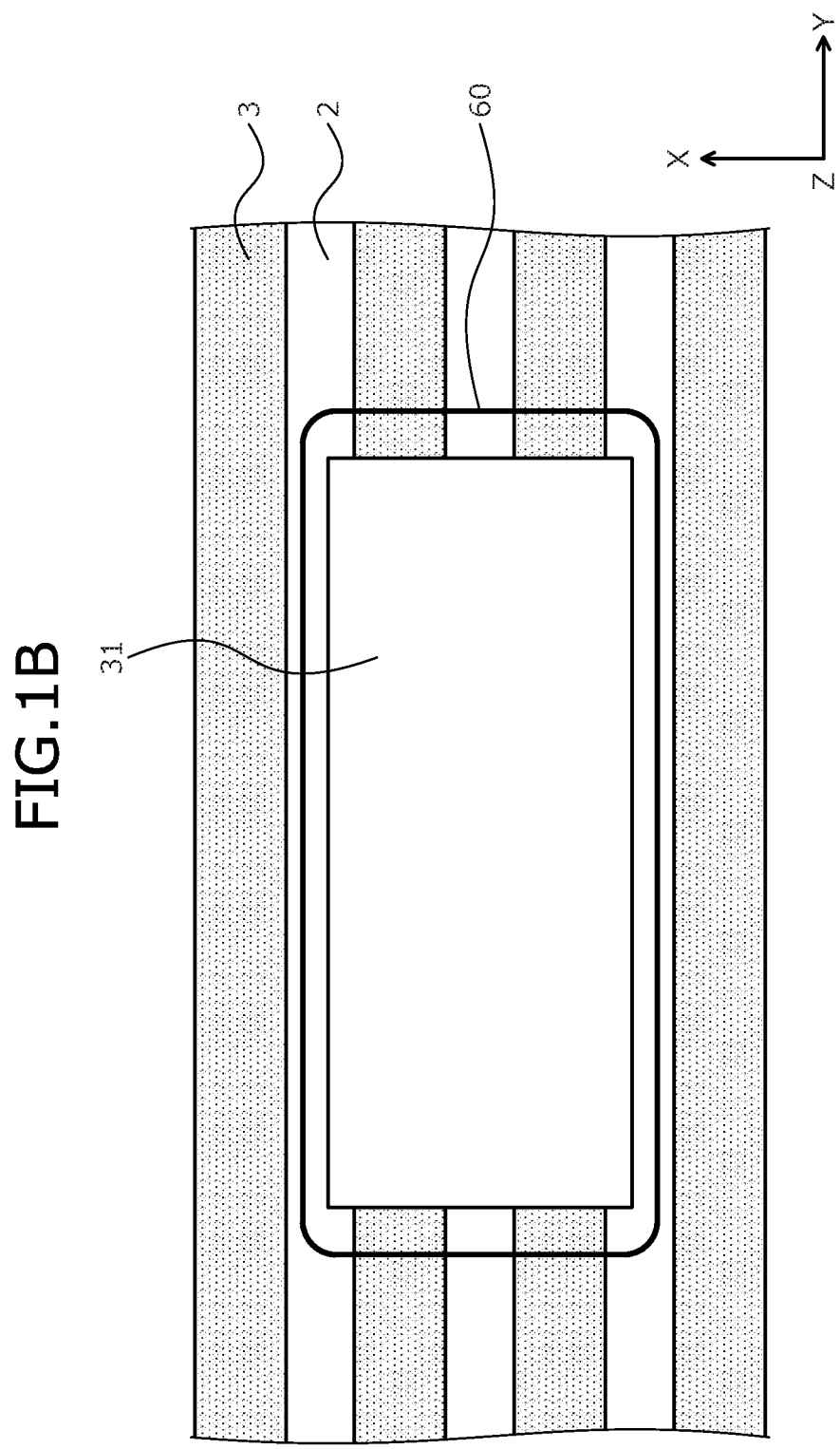

SEMICONDUCTOR DEVICE

CROSS REFERENCE TO RELATED APPLICATIONS

This is a continuation application of International Application PCT/JP2017/017428 filed on May 8, 2017 which claims priority from a Japanese Patent Application No. 2016-111760 filed on Jun. 3, 2016, the contents of which are incorporated herein by reference.

BACKGROUND OF THE INVENTION

1. Field of the Invention

Embodiments of the invention relate to a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. Therefore, in terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, wide bandgap semiconductor material), such as gallium nitride (GaN). Thus, a high-voltage semiconductor device can be achieved by using a wide bandgap semiconductor material (see, for example, B. Jayant Baliga, et al, "Silicon Carbide Power Devices", USA, World Scientific Publishing Co., Mar. 30, 2006, p. 61).

For such a high-voltage semiconductor device using silicon carbide, for example, when used in an inverter, the extent to which loss occurs is reduced, and the high-voltage semiconductor device may be used for carrier frequency applications 10 times higher than that of a conventional semiconductor device using silicon. When the high-voltage semiconductor device is used for a high carrier frequency application, the temperature of the heat generated by a semiconductor chip constituting the high-voltage semiconductor device increases and adversely affects the reliability of the semiconductor device. In particular, a bonding wire is mounted by a bonding device (bonder) to a front electrode provided on a front surface of the semiconductor chip and adhesion of the front electrode and the bonding wire decreases due to use under high temperatures, adversely affecting the reliability of the semiconductor device.

Another wiring structure has been proposed in which in place of a bonding wire, a plate-shaped wiring member constituting an external connection terminal that carries potential of a front electrode to the outside is mounted to the front electrode (for example, refer to Japanese Laid-Open Patent Publication No. 2014-099444, paragraphs 0032 to 0034). In Japanese Laid-Open Patent Publication No. 2014-99444, a heat capacity of the wiring member itself is made larger than a heat capacity of the bonding wire and a mathematical area of contact with the semiconductor chip is increased, whereby heat dissipation efficiency is improved.

Another wiring structure has been proposed in which a pin-shaped wiring member (hereinafter, terminal pin) constituting an external connection terminal is mounted to a front electrode, in an upright state of being substantially vertical with respect to a front surface of a chip. In a semiconductor device configured with a wiring structure using a terminal pin, the terminal pin is mounted on an electrode pad (front electrode) provided on the front surface of the chip, via a plating film and a solder layer.

A device in which a protection circuit for protecting a main semiconductor element is arranged on a single silicon carbide substrate together with the main semiconductor element that performs a predetermined operation is a conventionally known semiconductor device. As one such semiconductor device, a device has been proposed in which on a same semiconductor substrate as a power semiconductor element part, a temperature sensor diode part that detects temperature changes of the power semiconductor element part is provided (for example, refer to Japanese Laid-Open Patent Publication No. 2014-216465).

SUMMARY OF THE INVENTION

According to an embodiment of the present invention, a semiconductor device includes a semiconductor element arranged on a semiconductor substrate containing a semiconductor material having a bandgap wider than that of silicon; a current sensing part arranged on the semiconductor substrate and configured to detect a current flowing in the semiconductor element; and an isolating part provided between the semiconductor element and the current sensing part, the isolating part isolating the semiconductor element and the current sensing part. The isolating part has a trench provided at a predetermined depth in the semiconductor substrate, and an insulating film provided in the trench.

In the embodiment, the isolating part has a conductive layer embedded in the trench, via the insulating film.

In the embodiment, only the insulating film is embedded in the trench.

In the embodiment, the current sensing part has an element structure constituted by a portion of an element structure of the semiconductor element.

In the embodiment, the semiconductor element surrounds a periphery of the current sensing part.

In the embodiment, the semiconductor element has a first semiconductor region of a second conductivity type provided on a front surface side of the semiconductor substrate of a first conductivity type; a second semiconductor region of the first conductivity type selectively provided in the first semiconductor region; a gate insulating film provided in contact with a region of the first semiconductor region between the second semiconductor region and the semiconductor substrate; a gate electrode opposing the first semiconductor region across the gate insulating film; a first electrode in contact with the first semiconductor region and the second semiconductor region, and a second electrode in contact with a rear surface of the semiconductor substrate.

In the embodiment, the semiconductor device further includes a plurality of electrode pads arranged in a predetermined layout on a front surface of the semiconductor substrate. The first electrode is an electrode pad that is among the plurality of electrode pads and electrically connected to the semiconductor element. The semiconductor element and the current sensing part are electrically connected to a respective electrode pad among the plurality of electrode pads.

In the embodiment, the first semiconductor region and the second semiconductor region are arranged in a predetermined layout opposing the plurality of electrode pads in a depth direction.

In the embodiment, the current sensing part is configured at a portion of the first semiconductor region and a portion of the second semiconductor region, the portion of the first semiconductor region and the portion of the second semiconductor region opposing, in the depth direction, the electrode pad electrically connected to the current sensing part.

In the embodiment, a terminal pin carrying out a potential of the plurality of electrode pads is soldered on each of the plurality of electrode pads via a respective plating film.

In the embodiment, the semiconductor material having a bandgap wider than that of silicon is silicon carbide.

In the embodiment, the semiconductor device further includes a third semiconductor region of the first conductivity type provided on a rear surface side of the semiconductor substrate. The third semiconductor region is in contact with the second electrode and has an impurity concentration higher than an impurity concentration of the semiconductor substrate. The semiconductor device further includes a fourth semiconductor region of the first conductivity type. The fourth semiconductor region is a part of the semiconductor substrate, excluding the first semiconductor region and the third semiconductor region. The isolating part reaches an interface of the third semiconductor region and the fourth semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1B is a plan view of a planar layout of main parts of FIG. 1A;

DETAILED DESCRIPTION OF THE INVENTION

Figure 1A:
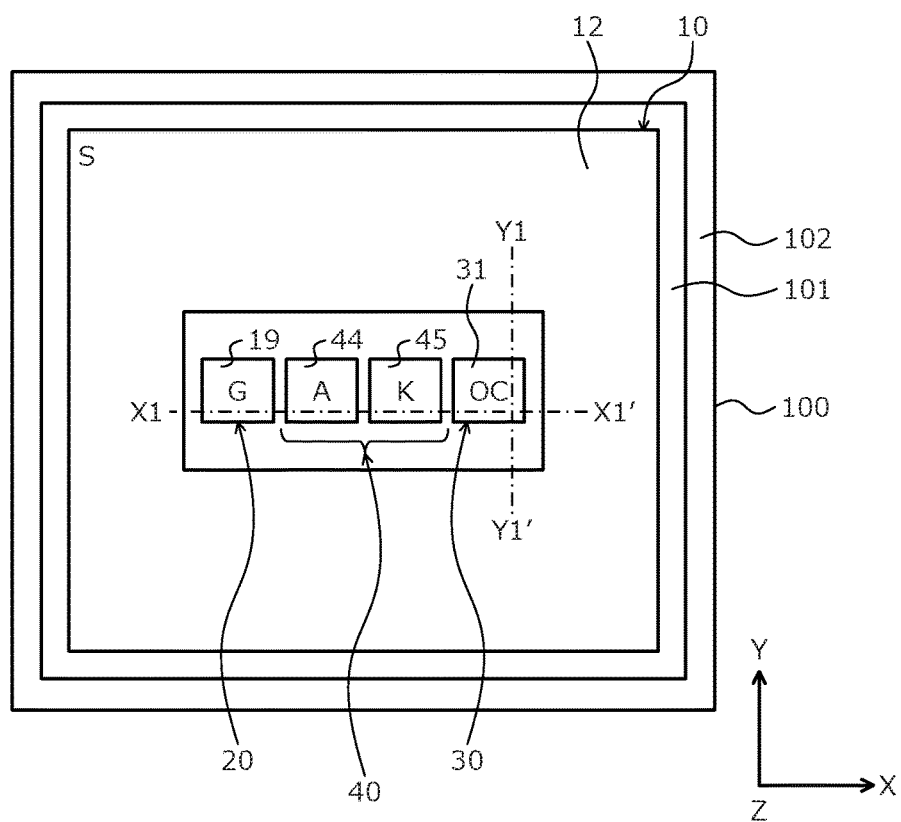
FIG. 1A is a plan view of an example of a planar layout of a semiconductor device according to a first embodiment.

First, problems associated with the related arts are discussed. When a current sensing part that detects current flowing in a main semiconductor element is arranged on the same semiconductor substrate as a main semiconductor element, as a protection circuit for protecting the main semiconductor element, a problem arises in that breakdown voltage of the current sensing part decreases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to an embodiment of the present invention contains a wide bandgap semiconductor material. In a first embodiment, a silicon carbide semiconductor device fabricated using, for example, silicon carbide (SiC) as the wide bandgap semiconductor material will be described. FIG. 1A is a plan view of an example of a planar layout of the semiconductor device according to the first embodiment. FIG. 1B is a plan view of a planar layout of main parts of FIG. 1A. As depicted in FIG. 1A, the semiconductor device according to the first embodiment has a main semiconductor element 10 and plural circuit parts that protect and/or control the main semiconductor element 10 provided on a single semiconductor base (hereinafter, silicon carbide base (semiconductor substrate (semiconductor chip))) 100 that contains silicon carbide.

As the circuit parts that protect and/or control the main semiconductor element 10, for example, a current sensing part 30, a temperature sensing part 40, an overvoltage protecting part (not depicted), a computing circuit part (not depicted), etc. are provided. The main semiconductor element 10 is a vertical MOSFET in which drift current flows in a vertical direction (a depth direction Z of the silicon carbide base 100) in an ON state. The main semiconductor element 10 is configured by plural (e.g., about a few hundred to a few tens of thousands) unit cells (functional units) that are arranged adjacently in an active region 101 and performs a main operation. The current sensing part 30 has a function of detecting overcurrent (OC) flowing in the main semiconductor element 10. The current sensing part 30 is a vertical MOSFET having several unit cells of a same configuration as those of the main semiconductor element 10.

The temperature sensing part 40 has a function of detecting a temperature of the main semiconductor element 10 by using diode temperature characteristics. The overvoltage protecting part is a diode that protects the main semiconductor element 10 from, for example, overvoltage (OV) such as surges. The computing circuit part has a function of controlling the current sensing part 30, the temperature sensing part 40 and the overvoltage protecting part. The computing circuit part has a function of controlling the main semiconductor element 10 based on output signals from the current sensing part 30, the temperature sensing part 40, the overvoltage protecting part, etc. The computing circuit part is configured by, for example, plural semiconductor elements such as complementary MOS (CMOS) circuits.

Electrode pads of the main semiconductor element 10 and of the circuit parts that protect and control the main semiconductor element 10 are arranged in a predetermined planar layout on a front surface of the silicon carbide base 100 and are separated by a predetermined interval. FIG. 1A depicts a case in which all of the electrode pads are arranged in the active region 101. The active region 101 is a region through which current flows during the ON state. An edge termination region 102 is a region that mitigates electric field at a base front surface side of a drift region and sustains the breakdown voltage. Further, in FIG. 1A, a source pad 12, a gate pad 19, an OC pad 31, an anode pad 44, and a cathode pad 45 are indicated by S, G, OC, A, and K, respectively.

The main semiconductor element 10 has a large current capability as compared to other circuit parts. Therefore, the source pad (electrode pad) 12 of the main semiconductor element 10 is arranged on substantially an entire surface of a region of an effective region (region used as the active region 101) in the active region 101, exclusive of regions in which electrode pads other than the source pad 12 are arranged. A planar layout of the source pad 12 may be variously modified according to necessary specifications. For example, the source pad 12 may be arranged in a substantially rectangular frame-shaped planar layout that surrounds all of the electrode pads, excluding the source pad 12. The electrode pads other than the source pad 12 may be arranged in a single row in a straight line at a central part of the active region 101.

The current sensing part 30 operates under the same conditions as the main semiconductor element 10 and thus, has the same element structure as the main semiconductor element 10. Therefore, the current sensing part 30 and an electrode pad (hereinafter, OC pad) 31 of the current sensing part 30 are arranged in an effective region in the active region 101. The current sensing part 30, for example, may be configured using a portion of the unit cells of the main semiconductor element 10. The electrode pads other than the source pad 12 and the OC pad 31 may be arranged in an inactive region (region not used as the active region 101) in the active region 101. The gate pad 19 of the main semiconductor element 10 may be arranged in the edge termination region 102.

Further, a periphery of the current sensing part 30 is surrounded by an isolating part 60 and the current sensing part 30 is isolated from the main semiconductor element 10 by the isolating part 60 (FIG. 1B). The isolating part 60, for example, is arranged in a substantially rectangular frame-shaped planar layout of about a same size as that of the OC pad 31. The isolating part 60 may be arranged to oppose the OC pad 31 in the depth direction Z. The isolating part 60 isolates semiconductor regions (a p-type base region 3, an $n^+$-type source region (not depicted) and a $p^+$-type contact region (not depicted)) constituting a MOS gate structure part of the main semiconductor element 10, from portions of the semiconductor regions forming a MOS gate structure part of the current sensing part 30. In FIG. 1B, the isolating part 60 is depicted by a thick line. Further, FIG. 1B depicts a case in which the p-type base region 3 (hatched portion) is arranged in a striped planar layout, and other parts constituting the MOS gate structure part are not depicted. A configuration of the isolating part 60 will be described hereinafter. The p-type base region 3 may correspond to a first semiconductor region.

The temperature sensing part 40 and the electrode pads (the anode pad 44 and the cathode pad 45) of the temperature sensing part 40 may be arranged near a region (e.g., the central part of the active region 101) where the current is large in the main semiconductor element 10, or may be arranged in the edge termination region 102. Although not depicted, the electrode pad (hereinafter, OV pad) of the overvoltage protecting part and the electrode pad (hereinafter, computing part pad) of the computing circuit part may be arranged in an effective region or an inactive region of the active region 101, or may be arranged in the edge termination region 102. Arrangement order of the electrode pads other than the source pad 12 may be variously modified according to necessary specifications.

Figure 2:
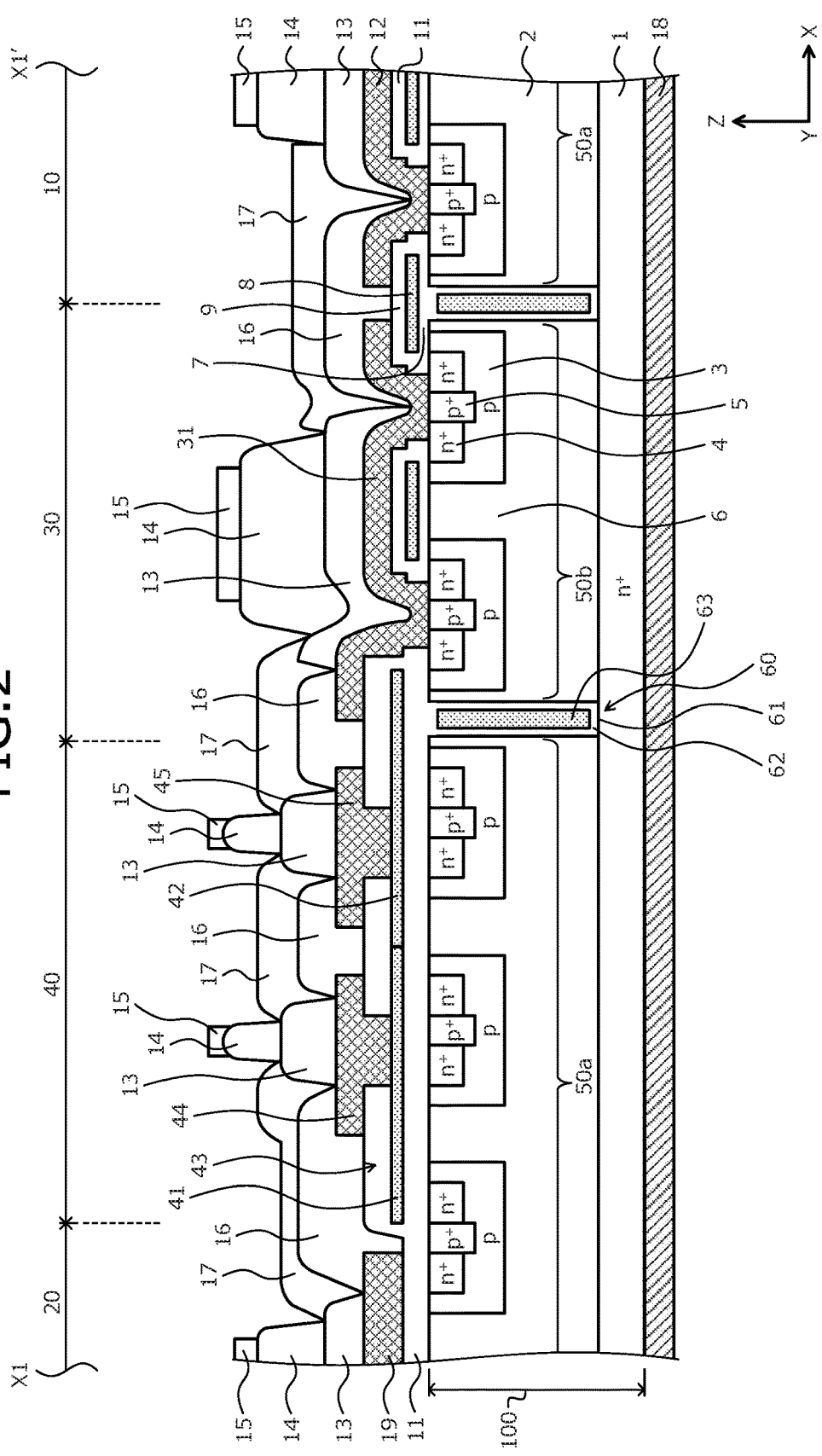
FIG. 2 is a cross-sectional view of a structure at cutting line X1-X1' in FIG. 1A.
Figure 3:
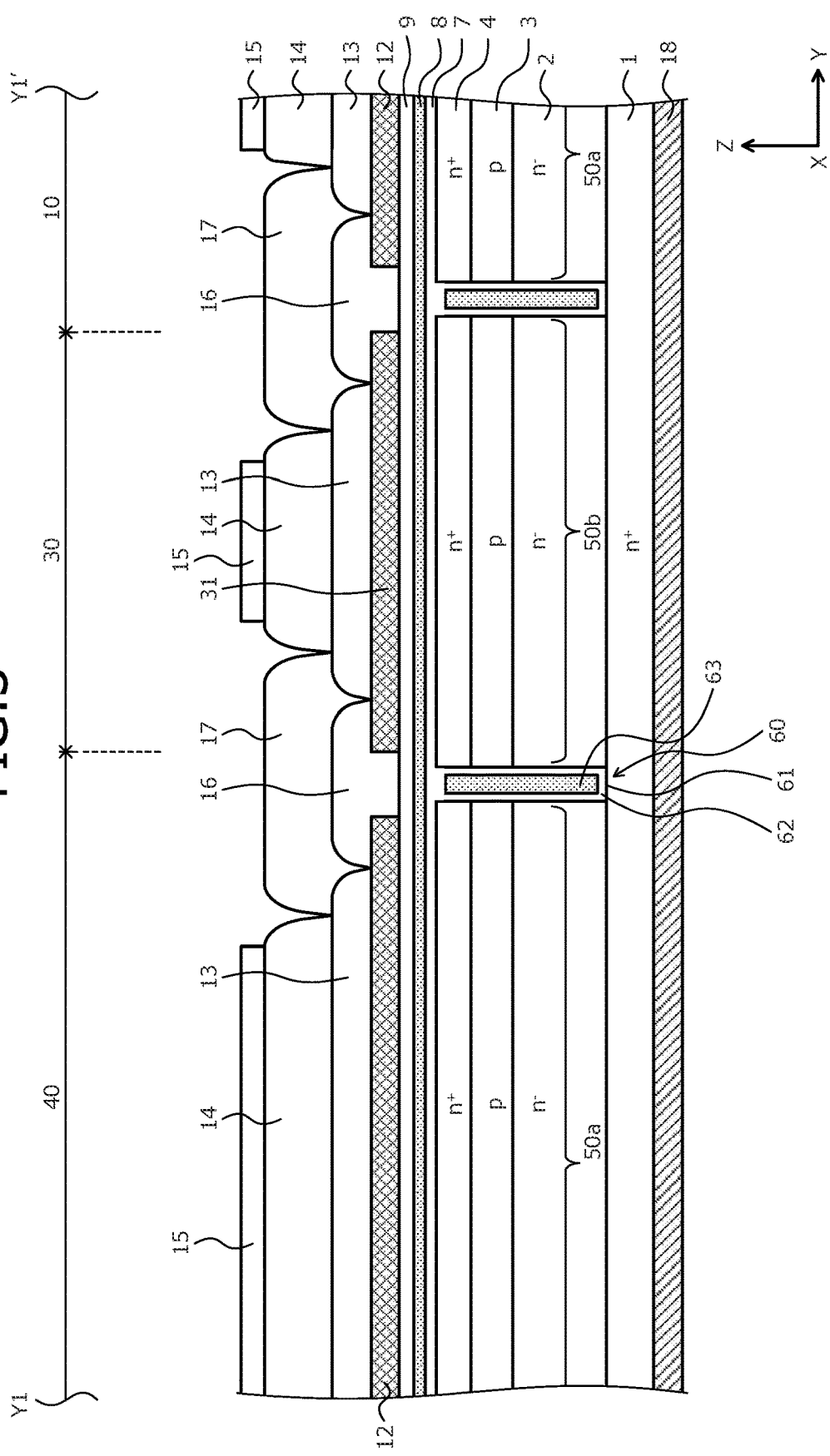
FIG. 3 is a cross-sectional view of the structure at cutting line Y1-Y1' in FIG. 1A.

A cross-sectional structure of the semiconductor device according to the first embodiment will be described taking, as an example, a case in which the main semiconductor element 10 is assumed to be a vertical MOSFET having a planar gate structure and the current sensing part 30 is assumed to be configured using portions of the unit cells of the main semiconductor element 10. FIG. 2 is a cross-sectional view of a structure at cutting line X1-X1' in FIG. 1A. FIG. 3 is a cross-sectional view of the structure at cutting line Y1-Y1' in FIG. 1A. In FIGS. 2 and 3, the active region 101 of the silicon carbide base 100 is depicted while the edge termination region 102 surrounding a periphery of the active region is not depicted. The main semiconductor element 10 and the circuit parts protecting and controlling the main semiconductor element 10 have wiring structures of a same configuration using a pin shaped wiring member (terminal pin described hereinafter) soldered to the electrode pad.

In particular, the main semiconductor element 10 includes a MOS gate structure part 50a constituted by the p-type base region 3, an $n^+$-type source region 4, a $p^+$-type contact region 5, a gate insulating film 7, and a gate electrode 8, toward the front surface of the silicon carbide base 100. One MOS gate structure part 50a constitutes one unit cell. The MOS gate structure part 50a, for example, is arranged in plural at a predetermined pitch along a direction (hereinafter, first direction) X parallel to a base front surface. The MOS gate structure part 50a of the main semiconductor element 10, for example, is arranged in a striped planar layout extending along a direction (direction penetrating FIG. 2, hereinafter, second direction) Y orthogonal to the first direction X.

A semiconductor region constituting the MOS gate structure part 50a of the main semiconductor element 10 is arranged at a predetermined pitch across the active region 101 overall irrespective of planar layouts of the electrode pads arranged in the active region 101. In other words, the active region 101 overall becomes an effective region. The silicon carbide base 100 is formed by stacking on a front surface of an $n^+$-type supporting substrate (hereinafter, $n^+$-type silicon carbide substrate) 1 containing, for example, silicon carbide, an $n^-$-type semiconductor layer (hereinafter, $n^-$-type silicon carbide layer) 2 containing silicon carbide. The $n^+$-type silicon carbide substrate 1 functions as a drain region of the main semiconductor element 10. The $n^+$-type silicon carbide substrate 1 may correspond to a third semiconductor region.

The p-type base region 3 is selectively provided in a surface layer on a first side (the base front surface side) of the n⁻-type silicon carbide layer 2 opposite a second side of the n⁻-type silicon carbide layer 2, the second side opposing the n⁺-type silicon carbide substrate 1. The n⁻-type silicon carbide layer 2 may correspond to a fourth semiconductor region. A portion of the n⁻-type silicon carbide layer 2 other than the p-type base region 3 is the drift region. The n⁺-type source region 4 and the p⁺-type contact region 5 are selectively provided in the p-type base region 3. The n⁺-type source region 4 may correspond to a second semiconductor region. A portion of the n⁻-type silicon carbide layer 2 between adjacent p-type base regions 3 is an n-type junction FET (JFET) region 6. The n-type JFET region 6 is arranged at a first side of the n⁺-type source region 4, opposite a second side of the n⁺-type source region 4 opposing the p⁺-type contact region 5, the n-type JFET region 6 being arranged separated from the n⁺-type source region 4.

The silicon carbide base 100 may be configured by sequentially stacking, in order stated, the n⁺-type silicon carbide substrate 1, the n⁻-type silicon carbide layer 2, and a p-type semiconductor layer (hereinafter, p-type silicon carbide layer) containing silicon carbide. In this case, the n⁺-type source region 4 and the p⁺-type contact region 5 are arranged in the p-type silicon carbide layer that constitutes a surface layer of the silicon carbide base 100. Additionally, a part of the p-type silicon carbide layer is inverted to an n-type by ion implantation, whereby the n-type JFET region 6 is arranged penetrating the p-type silicon carbide layer in the depth direction and in contact with the drift region. A portion of the p-type silicon carbide layer other than the n⁺-type source region 4, the p⁺-type contact region 5, and the n-type JFET region 6 is the p-type base region 3.

The n⁺-type source region 4 and the p⁺-type contact region 5 are arranged in the p-type base region 3, in a striped planar layout extending along the second direction Y similarly to the p-type base region 3. The n-type JFET region 6 is arranged between adjacent p-type base regions 3, in a striped planar layout extending along the second direction Y similarly to the p-type base region 3. The p-type base region 3, the n⁺-type source region 4, the p⁺-type contact region 5, and the n-type JFET region 6 are arranged not only at a portion (portion toward the drain region in the depth direction) in the active region 101 directly under the source pad 12, but also at portions not directly under the source pad 12 in the active region 101 overall.

The n⁺-type source region 4 and the p⁺-type contact region 5, at the portion directly under the source pad 12, are in contact with the source pad 12, via a contact hole provided in an interlayer insulating film 9. Portions of the n⁺-type source region 4 and the p⁺-type contact region 5 directly under the gate pad 19, the anode pad 44 and the cathode pad 45 are in contact with the source pad 12 at a non-depicted portion. The p-type base region 3, the n⁺-type source region 4, and the p⁺-type contact region 5 may be arranged in a striped planar layout extending along, for example, the second direction Y to contact (electrically contact) the source pad 12.

Of the MOS gate structure part arranged as the main semiconductor element 10 in the silicon carbide base 100, a portion directly under the OC pad 31 is used as a MOS gate structure part 50b of the current sensing part 30 and a portion other than this portion is the MOS gate structure part 50a of the main semiconductor element 10. In other words, the current sensing part 30 is configured by a part of the main semiconductor element 10 and includes the MOS gate structure part 50b of a same element structure as the main semiconductor element 10. At the portion directly under the OC pad 31, the n⁺-type source region 4 and the p⁺-type contact region 5 are in contact with the OC pad 31.

In particular, at least one of the p-type base regions 3, which have a striped shape, is the p-type base region 3 configuring the MOS gate structure part 50b of the current sensing part 30. Therefore, the MOS gate structure part 50a of the main semiconductor element 10 and the MOS gate structure part 50b of the current sensing part 30 are continuous along the second direction Y (FIG. 3). The OC pad 31 may be arranged to have a width (width along the first direction X) so as to oppose, in the depth direction, plural p-type base regions 3, which have a striped shape (FIG. 2).

Directly under the source pad 12 and the OC pad 31, the gate electrode 8 is provided on a surface of a portion of the p-type base region 3 between the n⁺-type source region 4 and the n-type JFET region 6, via the gate insulating film 7. On a surface of the n-type JFET region 6 configuring the same unit cell, the gate insulating film 7 may be extended and the gate electrode 8 may be provided so as to oppose the n-type JFET region 6 in the depth direction, across the gate insulating film 7.

The gate electrode 8 is not arranged in the temperature sensing part 40 or in a gate pad part 20. The p-type base region 3, the n⁺-type source region 4, the p⁺-type contact region 5, the n-type JFET region 6, the gate insulating film 7, and the gate electrode 8 constitute the MOS gate structure part 50a. The interlayer insulating film 9 is provided on the front surface of the silicon carbide base 100 overall so as to cover the gate electrode 8.

In the interlayer insulating film 9, plural contact holes for contact with the electrode pads (the source pad 12, the gate pad 19, the OC pad 31, the anode pad 44, and the cathode pad 45) are provided. On the interlayer insulating film 9, the electrode pads are arranged separated from each other. The electrode pads are electrically insulated by the interlayer insulating film 9, an oxide film 11 and first and second protection films 16, 17 described hereinafter.

The source pad 12 is a source electrode of the main semiconductor element 10. As described, the source pad 12 is in contact with the n⁺-type source region 4 and the p⁺-type contact region 5, via contact holes provided in the interlayer insulating film 9. The source pad 12 may have a stacked structure of stacked metal films. For example, the source pad 12 may have a stacked structure in which from the base front surface side, a barrier metal and a metal film containing aluminum (Al) are stacked sequentially.

The barrier metal constituting the source pad 12 may have a stacked structure in which, for example, from the base front surface side, a titanium nitride (TiN) film, a titanium (Ti) film, a titanium nitride film and a titanium film are stacked sequentially. The barrier metal has a function of preventing diffusion of metal atoms from the source electrode toward the silicon carbide base 100 and the interlayer insulating film 9. The barrier metal has a function of preventing a reaction between regions that oppose each other across the barrier metal.

On the source pad 12, a terminal pin 15 is mounted via a plating film 13 and a solder film 14. The terminal pin 15 is a round columnar shaped (cylindrical shaped) wiring member having a predetermined diameter and is an external connection terminal (e.g., an implant pin) that carries out potential of the source pad 12 to the outside. One end of the terminal pin 15 is exposed outside a case (not depicted) to which the semiconductor chip (the silicon carbide base 100) is mounted and is electrically connected to an external device (not depicted).

The terminal pin 15, even under high temperature conditions (e.g., 200 degrees C. to 300 degrees C.), has high adhesiveness with the source pad 12 and is resistant to peeling as compared to wire bonding. The other end of the terminal pin 15 is soldered to the plating film 13, in an upright state of being substantially vertical with respect to the base front surface. In FIGS. 2 and 3, the terminal pin 15 is depicted in a simplified manner. However, in actuality, the terminal pin 15 having a columnar shape is mounted to be vertically upright on the solder film 14.

Plural terminal pins 15 may be mounted to the source pad 12. A diameter and a quantity of the terminal pins 15 mounted to the source pad 12 are determined based on a current capability of the main semiconductor element 10. The greater the diameter of the terminal pin 15 is, or the greater the quantity of the terminal pins 15 mounted to the source pad 12 is, the greater the current capability of the main semiconductor element 10 is.

A portion of the source pad 12 other than a portion of the source pad 12 covered by the plating film 13 is covered by the first protection film 16. The first protection film 16 functions as a mask that prevents wetting and spreading of the plating film 13 at the time of formation of the plating film 13. On a boundary of the plating film 13 and the first protection film 16, the second protection film 17 is provided so as to cover an end of the first protection film 16 and an end of the plating film 13. The second protection film 17 functions as a mask that prevents wetting and spreading of the solder film 14 at the time of soldering of the terminal pin 15. The second protection film 17 may cover the first protection film 16 entirely. With the provision of the second protection film 17, even when a gap occurs between the plating film 13 and the first protection film 16, the source pad 12 is not exposed.

The gate pad 19 is provided in the gate pad part 20. The gate pad 19 has a stacked structure similar to that of the source pad 12. The gate pad 19, at a portion not depicted, is electrically connected to the gate electrode 8 of each unit cell configuring the current sensing part 30 and the main semiconductor element 10, via a contact hole provided in the interlayer insulating film 9. Further, the gate pad 19 is electrically insulated from the silicon carbide base 100 by the interlayer insulating film 9. On the gate pad 19, similarly to the source pad 12, the terminal pin 15 is mounted via the plating film 13 and the solder film 14. A diameter and a quantity of the terminal pins 15 mounted to the gate pad 19 are determined based on the current capability of the main semiconductor element 10. Further, the gate pad 19 functions as a gate pad of the current sensing part 30.

The OC pad 31 is a source electrode of the current sensing part 30. As described, the OC pad 31 is in contact with the $n^+$-type source region 4 and the $p^+$-type contact region 5, via the interlayer insulating film 9. The OC pad 31 has a stacked structure similar to that of the source pad 12. On the OC pad 31, similarly to the source pad 12, the terminal pin 15 is mounted via the plating film 13 and the solder film 14. A diameter and a quantity of the terminal pins 15 mounted to the OC pad 31 are determined based on a current capability of the current sensing part 30. Further, the OC pad 31 is electrically connected to the source pad 12, via a non-depicted sense resistor. The sense resistor has a function of detecting and diverting, as a small current, a part of drain current flowing with the turning ON/OFF of the main semiconductor element 10.

The temperature sensing part 40 is a diode 43 formed by a pn junction between a p-type poly-silicon (Poly-Si) layer 41 and an n-type poly-silicon layer 42. The p-type poly-silicon layer 41 and the n-type poly-silicon layer 42 are electrically insulated from the silicon carbide base 100 by the oxide film 11. Further, the p-type poly-silicon layer 41 and the n-type poly-silicon layer 42 are covered by the interlayer insulating film 9. The anode pad 44 and the cathode pad 45 are in contact with the p-type poly-silicon layer 41 and the n-type poly-silicon layer 42 respectively via contact holes provided in the interlayer insulating film 9. The anode pad 44 and the cathode pad 45 are respectively an anode electrode and a cathode electrode of the diode 43. The cathode pad 45 is electrically connected to the source pad 12 at a non-depicted part.

The anode pad 44 and the cathode pad 45 have a stacked structure similar to that of the source pad 12. On each of the anode pad 44 and the cathode pad 45, similarly to the source pad 12, the terminal pin 15 is mounted via the plating film 13 and the solder film 14. A diameter and a quantity of the terminal pins 15 mounted to the anode pad 44 and the cathode pad 45 are determined based on a current capability of the temperature sensing part 40. The temperature sensing part 40 may be a diode formed by a pn junction between an n-type region and a p-type region formed at a surface layer on the front surface of the silicon carbide base 100. The diode 43 constituting the temperature sensing part 40 may be arranged in the edge termination region 102.

The overvoltage protecting part (not depicted) may be arranged in the edge termination region 102. Element structures (including a front electrode) of semiconductor elements configuring the computing circuit part (not depicted) are arranged in an effective region of the active region 101. Front electrodes of another semiconductor element configuring the computing circuit part are electrically connected to the computing part pad. Stacked structures of the OV pad and the computing part pad are a same as that of the source pad 12. On each of the OV pad and the computing part pad, similarly to the source pad 12, the terminal pin 15 is mounted via the plating film 13 and the solder film 14. A diameter and a quantity of the terminal pins 15 mounted to the OV pad and the computing part pad are determined by a current capability of the overvoltage protecting part and of the computing circuit part, respectively.

In other words, substantially the entire front surface of the silicon carbide base 100 is covered by plural plating films 13 arranged separated by a predetermined interval. The plating film 13 on each of the electrode pads is electrically insulated by the first protection film 16. On an entire rear surface (rear surface of the $n^+$-type silicon carbide substrate 1) of the silicon carbide base 100, a rear electrode 18 is provided. The rear electrode 18 functions as a drain electrode of the main semiconductor element 10. The rear electrode 18 further functions as a drain electrode of the current sensing part 30. In other words, the drain electrode and the gate pad of the current sensing part 30 are common to the main semiconductor element 10.

The isolating part 60 is provided between the main semiconductor element 10 and the current sensing part 30. The isolating part 60 isolates the main semiconductor element 10 and the current sensing part 30. In particular, the isolating part 60 is constituted by a trench 61 provided a predetermined depth from the front surface of the silicon carbide base 100. An element structure of the current sensing part 30 is provided at a region of the silicon carbide base 100 isolated from an element structure of the main semiconductor element 10 by the trench 61. The trench 61 is arranged in a substantially rectangular frame-shaped planar layout surrounding a periphery of the current sensing part 30 (refer to FIG. 1B).

In particular, for example, a portion of the trench 61 parallel to the second direction Y isolates the p-type base region 3 configuring the MOS gate structure part 50b of the current sensing part 30 and an adjacent p-type base region 3 that constitutes the main semiconductor element 10 and that is adjacent in the first direction X (FIG. 2). Further, for example, a portion of the trench 61 parallel to the first direction X isolates a portion of the p-type base region 3 constituting the MOS gate structure part 50a of the main semiconductor element 10, from a portion of the p-type base region 3 constituting the MOS gate structure part 50b of the current sensing part 30 (the p-type base region 3 extending linearly (in a striped shape) along the second direction Y) (FIG. 3).

The deeper the trench 61 is, the greater the surge capability and breakdown capability of the current sensing part 30 may be improved. However, a depth of the trench 61 may be set to a depth whereby a predetermined surge capability and a predetermined breakdown capability of the current sensing part 30 are obtained. A reason for this is to avoid problems that occur when the trench 61 is made deep, such a longer etching period, an increased aspect ratio (=height/width) of the trench 61, poor embedding of a poly-silicon layer 63 described hereinafter, etc.

For example, the depth of the trench 61 need not reach an interface of the n$^+$-type silicon carbide substrate 1 and the n$^-$-type silicon carbide layer 2. Further, when the trench 61 is made deep, the depth of the trench 61 may reach the interface of the n$^+$-type silicon carbide substrate 1 and the n$^-$-type silicon carbide layer 2, from the base front surface, or may reach inside the n$^+$-type silicon carbide substrate 1. The width (width along the first direction X) of the trench 61, a thickness of an insulating film 62, and a thickness of the poly-silicon layer 63 may be variously modified provided the predetermined surge capability and the predetermined breakdown capability of the current sensing part 30 are obtained.

In the trench 61, the insulating film 62 is provided along inner walls of the trench 61, and a conductive layer (hereinafter, poly-silicon layer) 63 such as poly-silicon is provided on the insulating film 62. Provision of the insulating film 62 along the inner walls of the trench 61 electrically insulates portions of the silicon carbide base 100 opposing each other across the isolating part 60, along the first and the second directions X, Y. Additionally, embedding the poly-silicon layer 63 in the trench 61 via the insulating film 62 enables complete embedding of the trench 61 without voids. The poly-silicon layer 63 is covered by the interlayer insulating film 9.

The isolating part 60 has a function of suppressing electrical interference of the main semiconductor element 10 and the current sensing part 30, in the silicon carbide base 100. In particular, the isolating part 60 has a function of protecting the current sensing part 30 from, for example, overvoltage such as surges. In other words, the isolating part 60 improves the surge capability of the current sensing part 30 with respect to overvoltage. Further, the isolating part 60 has a function of blocking current flowing from the main semiconductor element 10 to the current sensing part 30 at the time of operation of the main semiconductor element 10. In other words, the isolating part 60 improves the breakdown capability of the current sensing part 30 with respect to current flowing from the main semiconductor element 10 to the current sensing part 30 at the time of operation of an intrinsic diode of the main semiconductor element 10. The intrinsic diode of the main semiconductor element 10 is a body diode formed by a pn junction between the p-type base region 3 and the drift region (n$^-$-type silicon carbide layer 2).

Here, although as an example, a case has been described in which an interval of the main semiconductor element 10 and the current sensing part 30 along the first direction X is equal to a cell pitch of the main semiconductor element 10, the interval of the main semiconductor element 10 and the current sensing part 30 along the first direction X may be variously modified according to necessary specifications. The smaller the interval of the main semiconductor element 10 and the current sensing part 30 along the first direction X is, the higher the surge capability and the breakdown capability of the current sensing part 30 may be expected to be and therefore, the effect is enhanced by the provision of the isolating part 60.

A method of manufacturing the semiconductor device according to the first embodiment will be described taking, as an example, a case in which, for example, the main semiconductor element 10 having a 1200V breakdown voltage is fabricated. First, the n$^+$-type silicon carbide substrate (semiconductor wafer) 1 is prepared. The n$^+$-type silicon carbide substrate 1 may be, for example, a silicon carbide single-crystal substrate doped with an n-type impurity (dopant) such as nitrogen (N) so that an impurity concentration thereof becomes 2.0×10$^{19}$/cm$^3$. A front surface of the n$^+$-type silicon carbide substrate 1 may be, for example, a (000-1) plane having an off-angle of 4 degrees in a <11-20> direction.

Next, on the front surface of the n$^+$-type silicon carbide substrate 1, the n$^-$-type silicon carbide layer 2 is formed by epitaxial growth and has a thickness of, for example, 10 μm. The n$^-$-type silicon carbide layer 2 may be doped with an n-type impurity such as nitrogen so that an impurity concentration thereof becomes, for example, 1.0×10$^{16}$/cm$^3$. By the steps up to here, the silicon carbide base 100 in which the n$^-$-type silicon carbide layer 2 is stacked on the front surface of the n$^+$-type silicon carbide substrate 1 is fabricated. Next, the p-type base region 3 of the main semiconductor element 10 is selectively formed in a surface layer of the n$^-$-type silicon carbide layer 2 by photolithography and ion implantation.

Next, a step including photolithography and ion implantation as a set is repeatedly performed with different ion implantation conditions, whereby the n$^+$-type source region 4, the p$^+$-type contact region 5, and the n-type JFET region 6 are formed. In these ion implantations, regions of the main semiconductor element 10 and regions of the same configuration (conductivity, impurity concentration, depth) for circuit parts arranged in the same silicon carbide base 100 as the main semiconductor element 10 are formed. Next, heat treatment (annealing) for activating the regions formed in the silicon carbide base 100 by ion implantation is performed, for example, at a temperature of about 1620 degrees C. for about 2 minutes.

Next, the trench 61 is formed by photolithography and etching. Next, for example, the front surface of the silicon carbide base 100 and the inner walls of the trench 61 are subject to thermal oxidation by heat treatment, forming the insulating film 62. Next, the poly-silicon layer 63 is deposited on the insulating film 62 so as to be embedded in the trench 61. Next, the poly-silicon layer 63 is etched, leaving the poly-silicon layer 63 only in the trench 61. Formation of the trench 61, the insulating film 62, and the poly-silicon layer 63 may be performed at any timing after deposition of the n$^-$-type silicon carbide layer 2, or before formation of the gate insulating film 7 described hereinafter.

Next, for example, the front surface of the silicon carbide base 100 is subject thermal oxidation by heat treatment, forming an insulating film having a thickness of, for example, about 100 nm. This thermal oxidation may be performed, for example, in a mixed gas atmosphere of oxygen ($O_2$) gas and hydrogen ($H_2$) gas at a temperature of about 1000 degrees C. As a result, the front surface of the silicon carbide base 100 overall is covered by the insulating film. The insulating film constitutes the gate insulating films 7 of the main semiconductor element 10 and the current sensing part 30, etc., and the oxide film 11 that electrically insulates the diode 43 and the silicon carbide base 100. Further, for example, the oxide film 11 may be made thicker by a chemical vapor deposition (CVD) method.

Next, on the insulating film, a poly-silicon layer doped with, for example, phosphorus (P) is formed. The poly-silicon layer is patterned and selectively removed so as to leave portions thereof as the gate electrodes 8 of the main semiconductor element 10 and the current sensing part 30, etc. At this time, from the poly-silicon layer doped with phosphorus, a portion constituting the diode 43 may be left. Thereafter, the portion of the poly-silicon layer doped with phosphorus left as the diode 43 is ion implanted at a predetermined timing, whereby the p-type poly-silicon layer 41 and the n-type poly-silicon layer 42 of the diode 43 are formed.

Next, on the front surface of the silicon carbide base 100 overall, the interlayer insulating film 9 is deposited (formed) so as to cover the gate electrodes 8. A thickness of the interlayer insulating film 9 is, for example, 1.0 μm. The interlayer insulating film 9 may be a material such as, for example, phosphorus glass (phosphosilicate glass (PSG)). Next, the interlayer insulating film 9 and the gate insulating film 7 are patterned by photolithography and etching, forming contact holes of the main semiconductor element 10 and of the circuit parts. Next, the interlayer insulating film 9 is planarized by heat treatment (reflow).

Next, for example, by a sputtering method, a metal film, for example, constituting a barrier metal is formed (deposited) on the interlayer insulating film 9 so as to be embedded in the contact holes. Next, for example, by a sputtering method, on the rear surface (rear surface of the $n^+$-type silicon carbide substrate 1) of the silicon carbide base 100, for example, a nickel (Ni) film constituting the rear electrode 18 is formed. Next, by heat treatment at a temperature of, for example, 970 degrees C., an ohmic contact is formed on both surfaces of the silicon carbide base 100. Next, for example, by a sputtering method, a metal film is further formed on the interlayer insulating film 9, thereby forming a stacked metal film constituting the electrode pads.

Next, the stacked metal film on the base front surface is patterned and selectively removed, whereby the electrode pads (the source pad 12, the gate pad 19, the OC pad 31, the anode pad 44 and the cathode pad 45, etc.) are left in a predetermined planar layout. Next, on the nickel film on the base rear surface, for example, a titanium film, a nickel film and a gold (Au) film constituting the rear electrode 18 are sequentially formed. Next, portions other than formation regions of the plating film 13 of the electrode pads are covered by the first protection film 16. At this time, the first protection film 16 is embedded between the electrode pads, thereby electrically insulating the electrode pads from each other.

Next, the first protection film 16 is used as a mask and the plating film 13 is formed at surfaces of the electrode pads. As a result, substantially the entire front surface of the silicon carbide base 100 is selectively covered by the plating film 13. Next, the boundary of the first protection film 16 and the plating film 13 is covered by the second protection film 17. Next, the terminal pin 15 is soldered (the solder film 14) on the plating film 13 of the electrode pads. Thereafter, the silicon carbide base 100 is cut (diced) into chips, whereby the MOSFET depicted in FIGS. 1A to 3 is completed.

The semiconductor device according to the first embodiment may be configured such that the MOS gate structure parts 50a, 50b respectively of the main semiconductor element 10 and the current sensing part 30 have a trench gate structure (not depicted). In this case, the trench 61 constituting the isolating part 60, the insulating film 62, and the poly-silicon layer 63 may be respectively formed concurrently by the same processes for the trench, the gate insulating film and the gate electrode constituting the trench gate structures of the MOS gate structure parts 50a, 50b.

As described, according to the first embodiment, a trench having at least inner walls covered by an insulating film is provided between a main semiconductor element and a current sensing part, whereby the main semiconductor element and the current sensing part are isolated in a silicon carbide part (silicon carbide base). As a result, overvoltage applied directly under the current sensing part from the silicon carbide base side is suppressed, enabling the surge capability of the current sensing part to be improved. Additionally, current flowing from an intrinsic diode of the main semiconductor element may be blocked, enabling the breakdown capability of the current sensing part to be improved. Therefore, decreases in the breakdown voltage of the current sensing part may be prevented.

Further, according to the first embodiment, improvement of the breakdown capability of the current sensing part, enables the intrinsic diode of the main semiconductor element to be used as, for example, a freewheeling diode (FWD) for changing a path of load current. Therefore, for example, when an inverter, etc. using the main semiconductor element is fabricated, the number of chips may be reduced since a diode used as a FWD and formed on a separate semiconductor chip from the main semiconductor element is unnecessary. As a result, the semiconductor device may be reduced in size.

Figure 4:
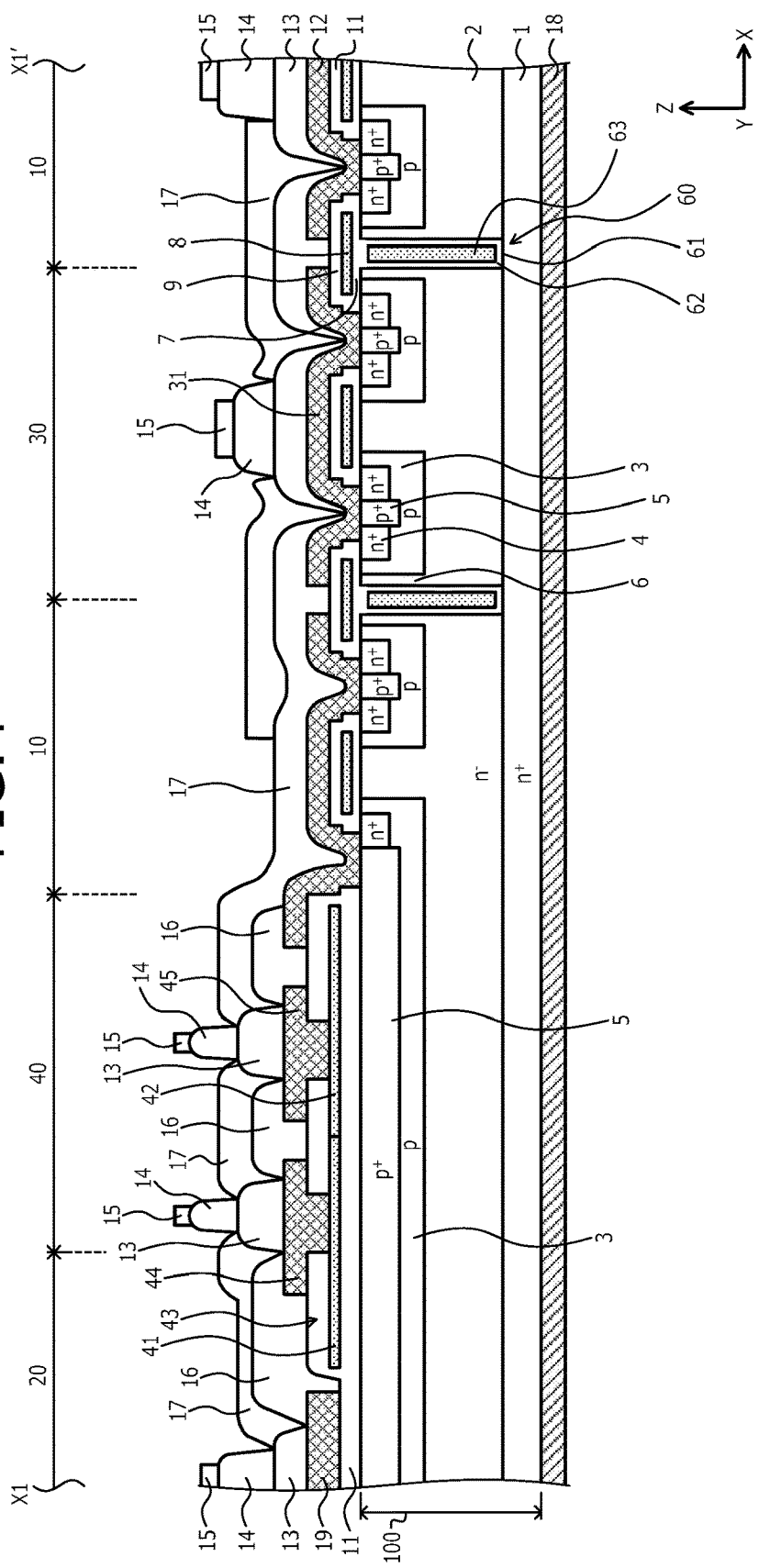
FIG. 4 is a cross-sectional view of a structure of the semiconductor device according to a second embodiment.

A structure of the semiconductor device according to a second embodiment will be described. FIG. 4 is a cross-sectional view of a structure of the semiconductor device according to the second embodiment. The semiconductor device according to the second embodiment differs from the semiconductor device according to the first embodiment in that the semiconductor region constituting the MOS gate structure part 50a directly under the gate pad 19, the anode pad 44 and the cathode pad 45 is not arranged and the corresponding region is an inactive region. In this case, the MOS gate structure part 50a of the main semiconductor element 10 is arranged so as to surround a periphery of the MOS gate structure part 50b of the current sensing part 30.

The MOS gate structure part may be arranged in a striped planar layout extending along the second direction Y, or may be arranged in a matrix-like planar layout. When the MOS gate structure part is arranged in a striped planar layout, the p-type base region 3, the $n^+$-type source region 4, the $p^+$-type contact region 5 and the n-type JFET region 6 are arranged in an effective region of the active region 101, in a striped planar layout extending along the second direction Y.

When the MOS gate structure part is arranged in a matrix-like planar layout, the p-type base region 3 is arranged in an effective region of the active region 101, in a matrix-like planar layout. The $p^+$-type contact region 5 is arranged near a central part of the p-type base region 3 and the n+-type source region 4 is arranged in a planar layout surrounding a periphery of the p+-type contact region 5. The n-type JFET region 6 is arranged in a grid-like planar layout passing between adjacent p-type base regions 3.

The p-type base region 3 and the p+-type contact region 5 constituting the current sensing part 30 or adjacent main semiconductor elements 10 may extend directly under the gate pad 19, the anode pad 44 and the cathode pad 45. The main semiconductor element 10 and the current sensing part 30 are electrically isolated by the isolating part 60. The MOS gate structure part 50a of the main semiconductor element 10 and the MOS gate structure part 50b of the current sensing part 30 may be arranged in different planar layouts.

In an inactive region directly under the gate pad 19, the anode pad 44 and the cathode pad 45, the p-type base region 3 and the p+-type contact region 5 may extend uniformly from a boundary with an effective region across the inactive region overall.

As described, according to the second embodiment, even when an inactive region is provided in the active region, effects similar to those of the first embodiment may be obtained.

Figure 5:
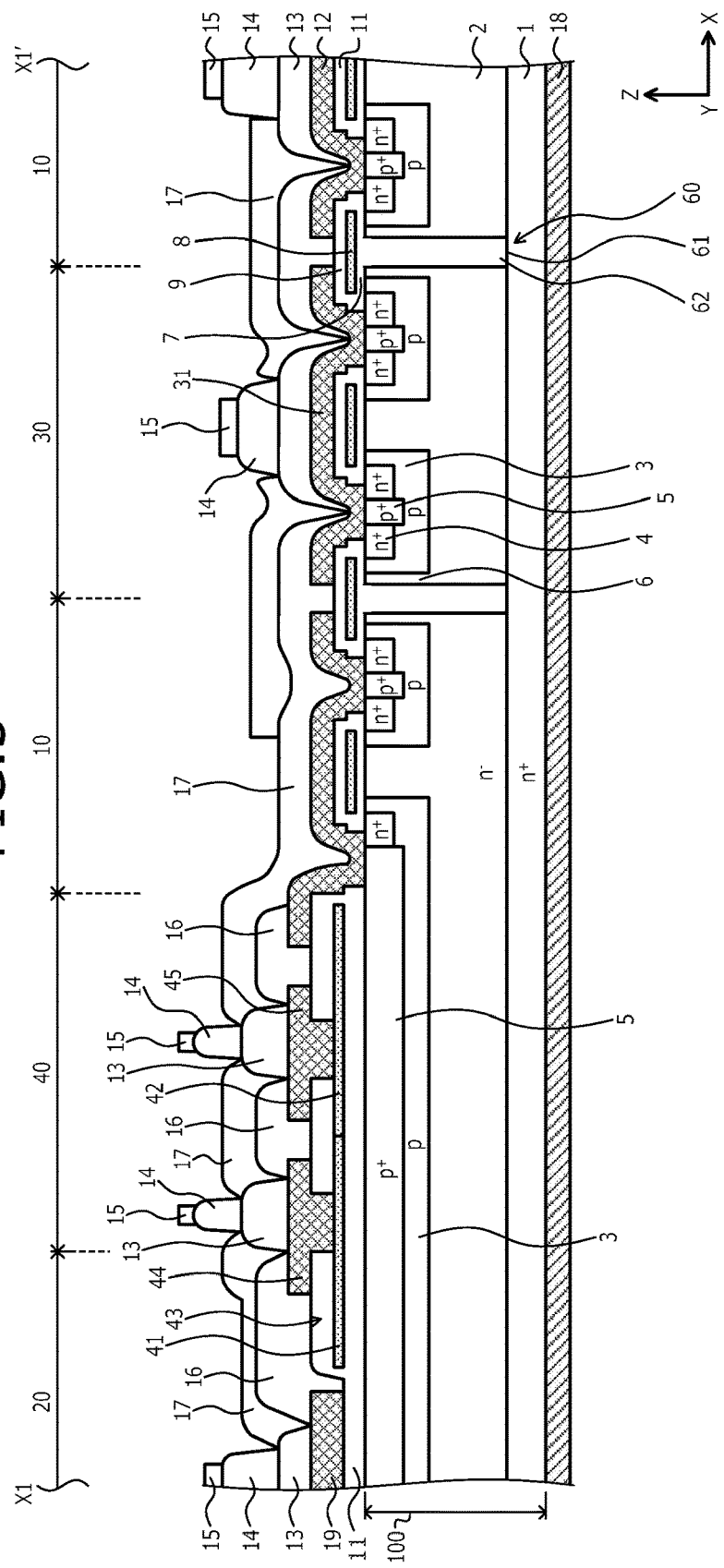
FIG. 5 is a cross-sectional view of a structure of the semiconductor device according to a third embodiment.

A structure of the semiconductor device according to a third embodiment will be described. FIG. 5 is a cross-sectional view of a structure of the semiconductor device according to the third embodiment. The semiconductor device according to the third embodiment differs from the semiconductor device according to the second embodiment in that only the insulating film 62 is embedded in the trench 61 constituting the isolating part 60. When the trench 61 may be completely embedded with the insulating film 62, a function as the isolating part 60 is obtained even without embedding poly-silicon in the trench 61. For example, the trench 61 may be completely embedded with the insulating film 62 by using a deposition method such as a CVD method. Therefore, the trench 61 may be completely embedded even without embedding the poly-silicon layer in the trench 61.

The third embodiment may be applied to the first embodiment.

As described, according to the third embodiment, even when the isolating part has a structure in which only the insulating film is embedded in the trench and the isolating part is arranged between the current sensing part and the main semiconductor element, effects similar to those of the first and second embodiment may be obtained.

The present invention, without limitation to the embodiments, may be variously modified within a range not departing from the spirit of the invention. For example, although a case in which overcurrent of a main semiconductor element is detected by a current sensing part has been described as an example, application to a semiconductor device in which overcurrent of another MOSFET arranged on the same silicon carbide base as the current sensing part is possible. Further, application to a semiconductor device in which the wiring structure uses, for example, a bonding wire or a plate-shaped wiring member in place of the terminal pin is also possible.

Dimensions, impurity concentrations, etc. of regions are variously set according to required specifications. Further, the present invention achieves similar effects in a semiconductor device that uses a different wide bandgap semiconductor material such as gallium nitride (GaN) and in a semiconductor device that uses silicon. In the embodiments, although a first conductivity type is assumed to be an n-type and a second conductivity type is assumed to be a p-type, the invention is similarly implemented when the first conductivity type is a p-type and the second conductivity type is an n-type.

According to the embodiments of the present invention, in a silicon part (semiconductor substrate), a main semiconductor element (semiconductor element) and a current sensing part are isolated by an isolating part. As a result, overvoltage applied to the current sensing part from the semiconductor substrate side is suppressed, enabling the surge capability of the current sensing part to be improved. Additionally, current flowing from an intrinsic diode of the main semiconductor element may be blocked, enabling the breakdown capability of the current sensing part to be improved.

The semiconductor device of the present invention achieves an effect in that even in a semiconductor device in which a current sensing part that detects current flowing in a main semiconductor element is provided on a same semiconductor substrate as the main semiconductor element, decreases in the breakdown voltage of the current sensing part may be prevented.

As described, the semiconductor device according to the embodiments of the present invention is useful for a semiconductor device used as switching device and is particularly suitable for a vertical semiconductor device that uses silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate containing a semiconductor material having a bandgap wider than that of silicon, the semiconductor substrate having a front surface and a rear surface;
   a semiconductor element disposed on the front surface of the semiconductor substrate; and
   a current sensing part on the semiconductor substrate and being configured to detect a current flowing in the semiconductor element; and
   an isolating part disposed in a trench between the semiconductor element and the current sensing part to isolate the semiconductor element from the current sensing part, the isolating part including an insulating film in the trench, the trench reaching the front surface of the semiconductor substrate.

2. The semiconductor device according to claim 1, wherein the isolating part has a conductive layer embedded in the trench, via the insulating film.

3. The semiconductor device according to claim 1, wherein only the insulating film is embedded in the trench.

4. The semiconductor device according to claim 1, wherein the semiconductor element and the current sensing part include an element that is commonly used therein.

5. The semiconductor device according to claim 1, wherein the semiconductor element surrounds a periphery of the current sensing part.

6. The semiconductor device according to claim 1, further comprising a third semiconductor region of the first conductivity type, formed on the front surface of the semiconductor substrate and having a front surface, wherein the semiconductor substrate is of a first conductivity type, the semiconductor element has:
- a plurality of first semiconductor regions of a second conductivity type provided in the front surface of the third semiconductor region,
- a second semiconductor region of the first conductivity type selectively provided in each of the first semiconductor regions;
- a gate insulating film provided in contact with the front surface of the first semiconductor region in a region between adjacent two first semiconductor regions,
- a gate electrode provided on the gate insulating film,
- a first electrode in contact with the first semiconductor region and the second semiconductor region, and
- a second electrode in contact with the rear surface of the semiconductor substrate.

7. The semiconductor device according to claim 6, further comprising
a plurality of electrode pads arranged at a side of the front surface of the semiconductor substrate, the plurality of electrode pads including the first electrode, the first electrode being electrically connected to the semiconductor element, wherein
each of the semiconductor element and the current sensing part is electrically connected to one of the plurality of electrode pads.

8. The semiconductor device according to claim 7, wherein the first semiconductor region and the second semiconductor region are arranged in a layout corresponding to a layout of the plurality of electrode pads in a depth direction.

9. The semiconductor device according to claim 7, wherein the current sensing part is configured at a portion of the first semiconductor region and a portion of the second semiconductor region, the portion of the first semiconductor region and the portion of the second semiconductor region corresponding to an area of the electrode pad that is electrically connected to the current sensing part in a depth direction.

10. The semiconductor device according to claim 9, further comprising:
- a plurality of plating films respectively disposed on the plurality of electrode pads; and
- a plurality of terminal pins respectively soldered on the plurality of electrode pads via respective plating films.

11. The semiconductor device according to claim 1, wherein the semiconductor material having a bandgap wider than that of silicon is silicon carbide.

* * * * *